United States Patent
Gopal et al.

(10) Patent No.: US 8,042,025 B2
(45) Date of Patent: *Oct. 18, 2011

(54) DETERMINING A MESSAGE RESIDUE

(75) Inventors: Vinodh Gopal, Westborough, MA (US); Gilbert Wolrich, Framingham, MA (US); Wajdi Feghali, Boston, MA (US); Erdinc Ozturk, Worcester, MA (US); Shay Gueron, Haifa (IL)

(73) Assignee: Intel Corporation, Santa Clara, CA (US)

( * ) Notice: Subject to any disclaimer, the term of this patent is extended or adjusted under 35 U.S.C. 154(b) by 335 days.

This patent is subject to a terminal disclaimer.

(21) Appl. No.: 12/291,621

(22) Filed: Nov. 12, 2008

(65) Prior Publication Data

US 2009/0158132 A1    Jun. 18, 2009

Related U.S. Application Data

(63) Continuation-in-part of application No. 11/959,142, filed on Dec. 18, 2007.

(51) Int. Cl.
*H03M 13/03* (2006.01)
(52) U.S. Cl. ......................... 714/781; 714/751
(58) Field of Classification Search .................. 714/781, 714/751
See application file for complete search history.

(56) References Cited

U.S. PATENT DOCUMENTS

| | | | |
|---|---|---|---|
| 3,980,874 A | 9/1976 | Vora | |
| 4,945,537 A * | 7/1990 | Harada | 714/781 |
| 4,949,294 A | 8/1990 | Wambergue | |
| 5,166,978 A | 11/1992 | Quisquater | |
| 5,274,707 A | 12/1993 | Schlafly | |
| 5,363,107 A * | 11/1994 | Gertz et al. | 342/26 B |
| 5,384,786 A * | 1/1995 | Dudley et al. | 714/784 |
| 5,642,367 A * | 6/1997 | Kao | 714/784 |
| 5,920,702 A * | 7/1999 | Bleidt et al. | 709/231 |
| 5,942,005 A * | 8/1999 | Hassner et al. | 714/784 |
| 6,128,766 A * | 10/2000 | Fahmi et al. | 714/807 |
| 6,185,596 B1 | 2/2001 | Hadad et al. | |
| 6,223,320 B1 | 4/2001 | Dubey et al. | |
| 6,396,926 B1 | 5/2002 | Takagi et al. | |
| 6,484,192 B1 | 11/2002 | Matsuo | |
| 6,530,057 B1 * | 3/2003 | Kimmitt | 714/758 |
| 6,609,410 B2 | 8/2003 | Axe et al. | |
| 6,666,381 B1 | 12/2003 | Kaminaga et al. | |

(Continued)

FOREIGN PATENT DOCUMENTS

WO    2008/002828 A2    1/2008

(Continued)

OTHER PUBLICATIONS

International Search Report/Written Opinion for PCT Patent Application No. PCT/US2008/085284, mailed on May 18, 2009, pp. 11.

(Continued)

*Primary Examiner* — M. Mujtaba K Chaudry (57) ABSTRACT

In one aspect, circuitry to determine a modular remainder with respect to a polynomial of a message comprised of a series of segment. In another aspect, circuitry to access at least a portion of a first number having a first endian format, determine a second number based on a bit reflection and shift of a third number having an endian format opposite to that of the first endian format, and perform a polynomial multiplication of the first number and the at least a portion of the first number.

15 Claims, 10 Drawing Sheets

U.S. PATENT DOCUMENTS

| | | | |
|---|---|---|---|
| 6,721,771 | B1 | 4/2004 | Chang |
| 6,728,052 | B2 * | 4/2004 | Kondo et al. .................. 360/53 |
| 6,732,317 | B1 | 5/2004 | Lo |
| 6,795,946 | B1 | 9/2004 | Drummond-Murray et al. |
| 6,904,558 | B2 | 6/2005 | Cavanna et al. |
| 7,027,597 | B1 | 4/2006 | Stojancic et al. |
| 7,027,598 | B1 | 4/2006 | Stojancic et al. |
| 7,058,787 | B2 | 6/2006 | Brognara et al. |
| 7,171,604 | B2 * | 1/2007 | Sydir et al. ................... 714/758 |
| 7,187,770 | B1 | 3/2007 | Maddury et al. |
| 7,190,681 | B1 * | 3/2007 | Wu ............................. 370/316 |
| 7,243,289 | B1 | 7/2007 | Madhusudhana et al. |
| 7,343,541 | B2 * | 3/2008 | Oren ............................ 714/758 |
| 7,428,693 | B2 | 9/2008 | Obuchi et al. |
| 7,458,006 | B2 | 11/2008 | Cavanna et al. |
| 7,461,115 | B2 | 12/2008 | Eberle et al. |
| 7,543,214 | B2 | 6/2009 | Ricci |
| 2002/0053232 | A1 | 5/2002 | Axe et al. |
| 2002/0126838 | A1 | 9/2002 | Shimbo et al. |
| 2002/0144208 | A1 | 10/2002 | Gallezot et al. |
| 2003/0167440 | A1 | 9/2003 | Cavanna et al. |
| 2003/0202657 | A1 | 10/2003 | She |
| 2003/0212729 | A1 | 11/2003 | Eberle et al. |
| 2004/0083251 | A1 | 4/2004 | Geiringer et al. |
| 2005/0044134 | A1 | 2/2005 | Krueger et al. |
| 2005/0138368 | A1 | 6/2005 | Sydir et al. |
| 2005/0149725 | A1 | 7/2005 | Sydir et al. |
| 2005/0149744 | A1 | 7/2005 | Sydir et al. |
| 2005/0149812 | A1 | 7/2005 | Hall et al. |
| 2005/0154960 | A1 * | 7/2005 | Sydir et al. ................... 714/758 |
| 2006/0059219 | A1 | 3/2006 | Koshy et al. |
| 2006/0282743 | A1 | 12/2006 | Kounavis |
| 2006/0282744 | A1 | 12/2006 | Kounavis |
| 2007/0083585 | A1 | 4/2007 | St Denis et al. |
| 2007/0150795 | A1 | 6/2007 | King et al. |
| 2007/0157030 | A1 | 7/2007 | Feghali et al. |
| 2007/0297601 | A1 | 12/2007 | Hasenplaugh et al. |
| 2008/0092020 | A1 | 4/2008 | Hasenplaugh et al. |
| 2008/0144811 | A1 | 6/2008 | Gopal et al. |
| 2009/0019342 | A1 | 1/2009 | Gueron et al. |
| 2009/0157784 | A1 | 6/2009 | Gopal et al. |
| 2009/0164546 | A1 | 6/2009 | Gopal et al. |
| 2009/0168999 | A1 | 7/2009 | Boswell et al. |

FOREIGN PATENT DOCUMENTS

| | | | |
|---|---|---|---|
| WO | 2008/002828 | A3 | 2/2008 |
| WO | 2009/012050 | A3 | 3/2009 |
| WO | 2009/082598 | A1 | 7/2009 |
| WO | 2009/085489 | A2 | 7/2009 |
| WO | 2009/012050 | A2 | 8/2009 |
| WO | 2009/085489 | A3 | 8/2009 |

OTHER PUBLICATIONS

International Preliminary Report on Patentability for PCT Patent Application No. PCT/US2008/085284, mailed on Jul. 1, 2010, 6 pages.

Williams, "A Painless Guide to CRC Error Detection Algorithms," Version 3, Aug. 19, 2003, Copyright 1993, 37 pages.

Nedjah et al., "A reconfigurable recursive and efficient hardware for Karatsuba-Ofman's multiplication algorithm", Proceedings of 2003 IEEE Conference on Control Applications, vol. 2, Jun. 23-25, 2003, pp. 1076-1081.

Nedjah et al., "A Review of Modular Multiplication Methods and Respective Hardware Implementation," Informatica, vol. 30, No. 1, 2006, pp. 111-129.

Tenca et al., "A Scalable Architecture for Montgomery Multiplication," Proceedings of the First International Workshop on Cryptographic Hardware and Embedded Systems, Lecture Notes in Computer Science, No. 1717, Springer-Verlag London, UK, 1999, pp. 94-108.

Kounavis et al., "A Systematic Approach to Building High Performance Software-based CRC Generators," Proceedings of the 10th IEEE Symposium on Computers and Communications, ISCC 2005, pp. 855-862.

Ramabadran et al., "A Tutorial on CRC Computations," Micro, IEEE, IEEE Computer Society, Aug. 1988, pp. 62-75.

Koc et al., "Analyzing and Comparing Montgomery Multiplication Algorithms," IEEE Micro, vol. 16, No. 3, 26-33, Jun. 1996, pp. 1-18.

Sprachmann, "Automatic Generation of Parallel Circuits," IEEE Design and Test of Computers, May-Jun. 2001, pp. 108-114.

Bosselaers et al., "Comparsion of three modular reduction function," Comparative Description and Evaluation, Katholieke Universiteit Leuven, Department of Electrical Engineering-ESAT Kardinaal Mercierlaan, Oct. 25, 1993, pp. 1-12.

Koopman et al., "Cyclic Redundancy Code (CRC) Polynomial Selection for Embedded Networks," The International Conference on Dependable Systems and Networks, DSN-2004, pp. 1-10.

Chin-Bou et al., "Design and Implementation of Long-Digit Karatsuba's Multiplication Alogorithm Using Tensor Product Formulation," Workshop on Compiler Techniques for High Performance Computing, 2003, pp. 1-8.

Dhem, "Design of an Efficient Public-Key Cryptographic Library for RISC-Based Smart Cards," Faculte Des Sciences appliquees Laboratoire de Microelectronique, Louvain-la-Neuve, Belgium, May 1998, 198 pages.

Fischer et al., "Duality Between Multiplication and Modular Reduction," Infineon Technologies AG, Secure Mobile Solutions, Munich, Germany, Intel Corporation, Systems Technology Laboratory, Hillsboro, OR, Mar. 2005, pp. 1-13.

Phatak et al., "Fast Modular Reduction for Large Wordlengths via One Linear and One Cyclic Convolution," Proceedings of the 17th IEEE Symposium on Computer Arithmetic, 2005, pp. 179-186.

Federal Information Processing Standards Publication 197, Announcing the Advanced Encryption Standard (AES), Nov. 26, 2001, 51 pages.

Montgomery, "Five, Six, and Seven-Term Karatsuba-Like Formulae," IEEE Transactions on Computers, vol. 54, No. 3, Mar. 2005, 8 pages.

Weimerskirch et al., "Generalizations of the Karatsuba Algorithm for Polynomial Multiplication," communication Security Group, Department of Electrical Engineering & Information Sciences, Bochum, Germany, Mar. 2002, pp. 1-23.

Lin et al., "High-Speed CRC Design for 10 Gbps applications," ISCAS 2006, IEEE, pp. 3177-3180.

Barrett, "Implementing the Rivest Shamir and Adleman Public Key Encryption Algorithm on a Standard Digital Signal Processor," Proceedings on Advances in cryptology-CRYPTO '86,Copyright (c) 1998, Springer-Verlag, Berlin 1987, pp. 311-323.

International Preliminary Report on on Patentability received for PCT Patent Application No. PCT/US2007/071829, mailed on Jan. 15, 2009, 7 pages.

Montgomery, "Modular Multiplication Without Trial Division," Mathematics of 'Computation, vol. 44, No. 170, Apr. 1985, pp. 519-521.

"Number Theory and Public Key Cryptography," Introduction to Number Theory, Apr. 1996, pp. 1-12.

Campobello et al., "Parallel CRF Realization," IEEE Transactions on Computers, vol. 52, No. 10, Oct. 2003, Published by the IEEE Computer Society, pp. 1312-1319.

Sedlak, "The RSA Cryptography Processor," Lecture Notes in Computer Science, Proceedings of the 6th annual international conference on Theory and application of cryptographic techniques, EUROCRYPT'87, 1987, Springer-Verlag Berlin, Heidelberg, pp. 95-105.

International Preliminary Report on Patentability received for PCT Application No. PCT/US2008/084571 mailed on Jul. 1, 2010, 6 pages.

International Search Report & Written Opinion received for PCT Application No. PCT/US2007/071829, received on Dec. 12, 2007, 10 Pages.

International Search Report and Written Opinion received for PCT Patent Application No. PCT/US2008/084571, mailed Jun. 18, 2009, 11 pages.

Office Action Received for Chinese Patent Application No. 200610172839.9, mailed on Apr. 15, 2010, 4 Pages of Chinese Office Action and 5 Pages of English Translation.

Office Action Received for Chinese Patent Application No. 200610172839.9, mailed on Feb. 6, 2009, 3 Pages of Chinese Office Action and 5 Pages of English Translation.

Office Action Received for Chinese Patent Application No. 200610172839.9, mailed on Jan. 8, 2010, 3 Pages of Chinese Office Action and 5 Pages of English Translation.

Office Action Received for Chinese Patent Application No. 200610172839.9, mailed on Jul. 30, 2010, 5 Pages of English Translation.

Office Action Received for Chinese Patent Application No. 200610172839.9, mailed on Sep. 18, 2009, 4 Pages of Chinese Office Action and 5 Pages of English Translation.

Office Action received for U.S. Appl. No. 11/610,919, mailed on Jul. 8, 2010, 7 pages.

Office Action Received for U.S. Appl. No. 11/476,432, mailed on Oct. 28, 2009, 24 pages.

Office Action Received for U.S. Appl. No. 11/476,432, mailed on May 26, 2010, 13 pages.

International Search Report and Written Opinion received for PCT Patent Application No. PCT/US2008/068801, mailed on Dec. 31, 2008, 10 pages.

International Preliminary Report on Patentability received for PCT Patent Application No. PCT/US2008/068801, mailed on Jan. 28, 2010, 6 pages.

Office Action received for U.S. Appl. No. 11/777,538, mailed on Jan. 8, 2010, 9 pages.

Office Action received for U.S. Appl. No. 11/777,538, mailed on Jul. 9, 2010, 6 pages.

Office Action Received for Taiwan Patent Application No. 096122784, mailed on Oct. 18, 2010, 10 Pages of Taiwan Office Action including 4 Pages of English Translation.

Office Action received for U.S. Appl. No. 11/959,142, mailed on Jun. 30, 2010, 11 pages.

Park et al., "Analysis of the Variable Length Nonzero Window Method for Exponentiation," 1999 Elsevier Science, Computers & Mathematics with Applications, vol. 37, Issue 7, Apr. 1999, pp. 21-29.

Gordon, "A survey of fast exponentiation methods," Center for Communications Research, Dec. 30, 1997, pp. 1-22.

* cited by examiner

```
R1 = <load next two segments>;   ⟵ 300      Operation
For(i=0; i<N; i++){
    R0 = <load next two segments>;              1
    R2 = R1;                                    2
    R1 = BMUL(R1, K).low;    // K1             3
    R2 = BMUL(R2, K).high;   // K2             4
    R0 = R0 + R1;                               5
    R0 = R0 + R2;                               6
    R1 = R0;                                    7
}
```

FIG. 3

| Cycle# | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|
| Port0 | 1a | 3a | 4a | 3b | 4b | 1a | 3a | 4a | 3b | 4b | 1a | 3a | 4a | 3b | 4b | 1a | 3a |
| Port1 | 2a | 1b | 5a | 6a | 7a | 2a | 7b | 5a | 6a | 7a | 2a | | 5a | 6a | 7a | 2a | |
| Port2 | | 2b | | | 5b | 6b | | 2b | 1b | 5b | 6b | 7b | 2b | 1b | 5b | 6b | 7b |
| #retired | | | | | 1 | | 2 | | | 3 | | 4 | | | 5 | | 6 |

| Cycle# | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| Port0 |  | 3a | 4a | 3b | 4b | 3c | 4c | 3d | 4d | 2a | 3a | 4a | 3b | 4b | 3c | 4c |
| Port1 | 1a | 1b | 1c | 1d | 5a | 6a | 7a | 6b | 7b | 6c | 7c | 6d | 7d | 5a | 6a | 7a |
| Port2 | 2a | 2b | 2c | 2d |  |  | 5b | 1a | 5c | 1b | 5d | 2b | 1c | 2c | 1d | 5b |
| #retired |  |  |  |  |  |  | 1 |  | 2 |  | 3 |  | 4 |  |  | 1 |

| Cycle# | 17 | 18 | 19 | 20 | 21 | 22 | 23 | 24 | 25 | 26 | 27 | 28 | 29 | 30 | 31 | 32 |
|---|---|---|---|---|---|---|---|---|---|---|---|---|---|---|---|---|
| Port0 | 2d | 3d | 4d | 3a | 4a | 3b | 4b | 2c | 3c | 4c | 3d | 4d | 3a | 4a | 2b | 3b |
| Port1 | 6b | 7b | 6c | 7c | 5d | 6d | 7d | 6a | 7a | 6b | 7b | 5c | 6c | 7c | 6d | 7d |
| Port2 | 1a | 5c | 2a | 1b | 2b | 1c | 5a | 1d | 5b | 2d | 1a | 2a | 1b | 5d | 1c | 5a |
| #retired |  | 2 |  | 3 |  |  | 4 |  | 1 |  | 2 |  |  | 3 |  | 4 |

| Cycle# | 33 | 34 | 35 | 36 | 37 | 38 | 39 | 40 | 41 | 42 | 43 | 44 | 45 | 46 | 47 | 48 |
|---|---|---|---|---|---|---|---|---|---|---|---|---|---|---|---|---|
| Port0 | 4b | 3c | 4c | 3d | 4d | 2a | 3a | 4a | 3b | 4b | 3c | 4c | 2d | 3d | 4d | 3a |
| Port1 | 6a | 7a | 5b | 6b | 7b | 6c | 7c | 6d | 7d | 5a | 6a | 7a | 6b | 7b | 6c | 7c |
| Port2 | 2c | 1d | 2d | 1a | 5c | 1b | 5d | 2b | 1c | 2c | 1d | 5b | 1a | 5c | 2a | 1b |
| #retired | 1 |  |  |  | 2 |  | 3 |  |  |  |  | 1 |  | 2 |  | 3 |

$a = a3\ a2\ a1\ a0$  $ar = \text{bitreflect}(a) = a0\ a1\ a2\ a3$
$b = b3\ b2\ b1\ b0$  $br = \text{bitreflect}(b) = b0\ b1\ b2\ b3$ $c = a * b =$
$$\begin{array}{r} a3\ a2\ a1\ a0 \\ b3\ b2\ b1\ b0 \\ \hline c7\ c6\ c5\ c4\ c3\ c2\ c1\ c0 \end{array}$$

$d = ar * br =$
$$\begin{array}{r} a0\ a1\ a2\ a3 \\ b0\ b1\ b2\ b3 \\ \hline d7\ d6\ d5\ d4\ d3\ d2\ d1\ d0 \end{array}$$

$a0b0 = c0$  $\quad$  $d0 = a3b3$
$a1b1 + a0b1 = c1$  $\quad$  $d1 = a3b2 + a2b3$
$a2b0 + a1b1 + a0b2 = c2$  $\quad$  $d2 = a3b1 + a2b2 + a1b3$
$a3b0 + a2b1 + a1b2 + a0b3 = c3$  $\quad$  $d3 = a3b0 + a2b1 + a1b2 + a0b3$
$a3b1 + a2b2 + a1b3 = c4$  $\quad$  $d4 = a2b0 + a1b1 + a0b2$
$a3b2 + a2b3 = c5$  $\quad$  $d5 = a1b0 + a0b1$
$a3b3 = c6$  $\quad$  $d6 = a0b0$
$0 = c7$  $\quad$  $d7 = 0$ $\therefore (d << 1) = \text{bitreflect}(c)$

FIG. 9

```
K1 = 2^y mod g;
K2 = 2^x mod g;

rK.high = bitreflect(K1) << 1;   //rK1
rK.low  = bitreflect(K2) << 1;   //rK2

R1 = <load next two segments>;

For(i=0; i<N; i++){
    R0 = <load next two segments>;
    R2 = R1;
    R1 = BMUL(R1, rK).high;  // K1
    R2 = BMUL(R2, rK).low;   // K2
    R0 = R0 + R1;
    R0 = R0 + R2;
    R1 = R0;
}
```

FIG. 10

DETERMINING A MESSAGE RESIDUE

REFERENCE TO RELATED APPLICATIONS

This application is a continuation-in-part and claims priority to U.S. application Ser. No. 11/959,142, entitled "Determining A Message Residue", filed on Dec. 18, 2007, by inventors Gilbert Wolrich, Michael Kounavis, and Vinodh Gopal, which is incorporated by reference in its entirety herein.

BACKGROUND

A variety of computer applications operate on messages to create a message residue. The residue can represent message contents much more compactly. Among other uses, message residues are frequently used to determine whether data transmitted over network connections or retrieved from a storage device may have been corrupted. For instance, a noisy transmission line may change a "1" signal to a "0", or vice versa. To detect corruption, a message is often accompanied by its message residue. A receiver of the data can then independently determine a residue for the message and compare the determined residue with the received residue.

A common message residue is known as a Cyclic Redundancy Check (CRC). A CRC computation is based on interpreting a stream of message bits as coefficients of a polynomial. For example, a message of "1010" corresponds to a polynomial of $(1\ x^3)+(0\ x^2)+(1\ x^1)+(0\ x^0)$ or, more simply, $x^3+x^1$. The message polynomial is divided by another polynomial known as the modulus. For example, the other polynomial may be "11" or x+1. A CRC is the remainder of a division of the message by the polynomial. CRC polynomial division, however, is somewhat different than ordinary division in that it is computed over the finite field GF(2) (i.e., the set of integers modulo 2). More simply put: even number coefficients become zeroes and odd number coefficients become ones.

DETAILED DESCRIPTION

Message residues are commonly used in many different protocols to protect data integrity. Computing these residues, however, imposes significant computational overhead. The following describes techniques that repeatedly whittle a message into a smaller set of equivalent data using fast, inexpensive operations. The resulting, smaller, set of data can then be processed, for example, in a conventional manner to arrive at a final message residue value. In other words, the more burdensome task of determining an exact value of a message residue is postponed until a message is reduced to a smaller size that retains the mathematical characteristics of the original message with respect to the residue.

Figure 1:
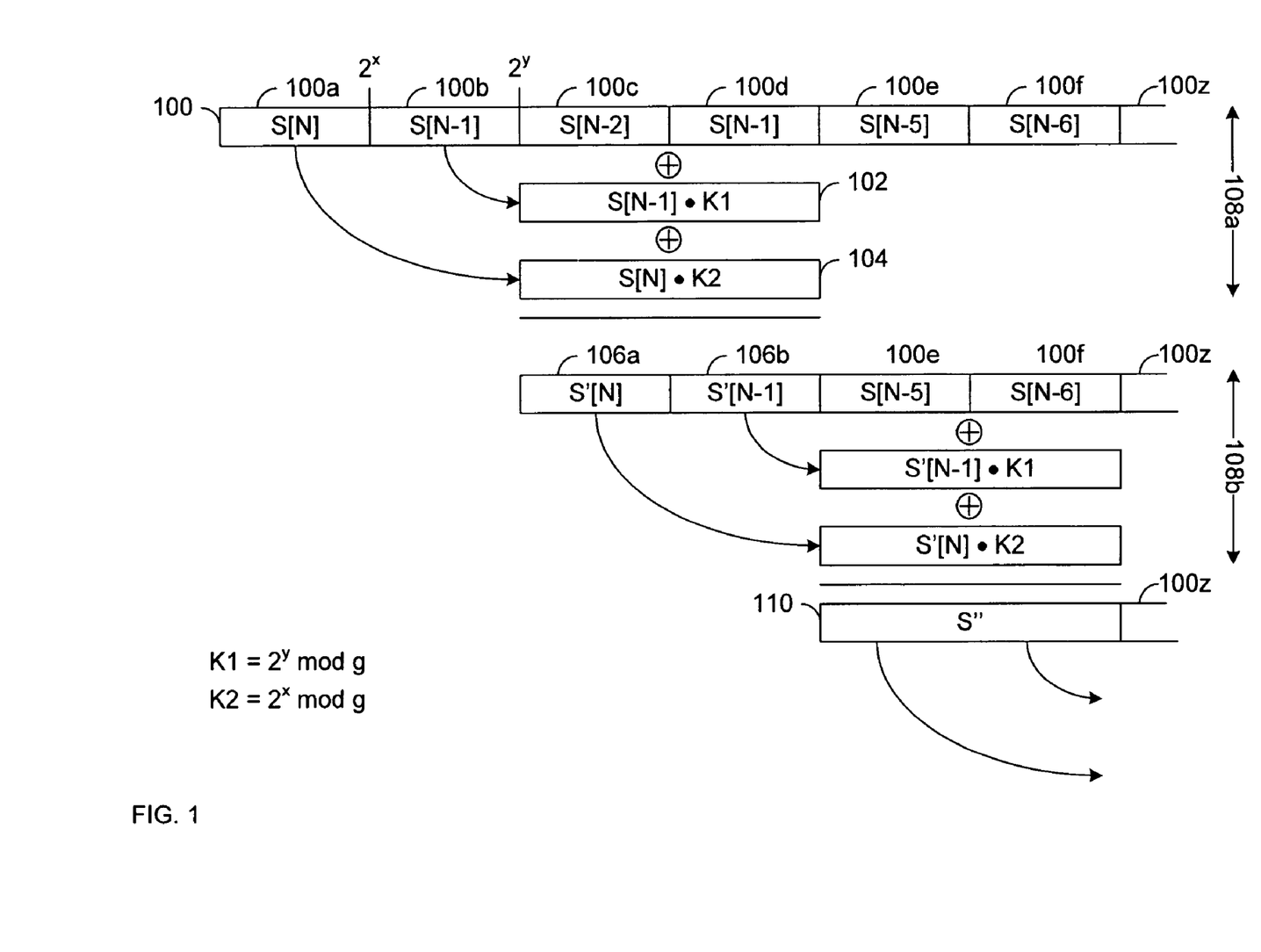
FIG. 1 is a diagram illustrating repeated reduction of message segments used to represent a message.

In greater detail, FIG. 1 depicts a message S 100. To determine a message residue, the bits of the message S can be handled as the coefficients of a polynomial S(x). For example, a 32-bit CRC of S can be defined as:

$$CRC = S \cdot 2^{32} \bmod g \qquad [1]$$

where g is a 33-bit polynomial. Different values of g have been defined for a variety of applications. For example, iSCSI (Internet Small Computer System Interface) defines a value of $11EDC6F41_{16}$ for g. Other applications have selected different polynomial sizes and values. Typically, the resulting CRC value is stored with the message, S, in the empty 32-least significant bits created by the $2^{32}$ shift. Alternately, the value may be stored in a packet field or other location. Recomputing the CRC value and comparing with the stored value can indicate whether data was corrupted.

As shown, S can be represented as a series of n-bit segments, labeled S[ ], 100a-100z. The following describes techniques that successively "fold" the most significant segments into remaining segments, repeatedly reducing the amount of data used to represent S. In particular, the determination of the different values (e.g., 102, 104) to fold into the remaining segments (e.g., 100c, 100d), can be independently computed, potentially permitting parallel computation of these values. In comparison with an approach that successively folds a single segment 100a at a time, folding multiple segments 100a, 100b at each iteration can greatly decrease computation time.

In greater detail, FIG. 1 depicts the first two 108a, 108b of a series of repeated folding operations that operate on a subset of segments. In the example shown, each subset features the four most significant remaining segments representing S. For example, the initial folding operation 108a operates on segments 100a, 100b, 100c, 100d. As shown, the operation 108a includes binary polynomial multiplication 102a of the most significant segment 100a by a first pre-computed constant K2 and a binary polynomial multiplication 104 of the next most significant segment 100b by a second pre-computed constant K1. The results of these multiplications 102, 104 are folded into the remaining message segments by XORing the results with the values of the least significant segments of the subset 100c, 100d to yield segments 106a, 106b. The values of these segments 106a, 106b preserve the contribution of the most significant segments 100a, 100b to the final determination of the residue for S. Thereafter, segments 100a, 100b can be discarded or ignored for residue purposes.

As shown, the segments 106a, 106b output from the first set of folding operations 108a can be combined with the next segments of S 100e, 100f to form a new subset of segments 106a, 106b, 100e, 100f. Again, a set of folding operation 108b proceeds, folding the most significant segments 106a, 106b into segments 100e, 100f by a multiplication of segment 106a by constant K2, a multiplication of segment 106b by a constant K1, and XOR-ing the results with segments 100e, 100f to yield segments 110 (labeled S").

This process of folding can repeat as desired to reduce the data representing S by two segments for each iteration. The reduction may be repeated any number of times. For example, in the sample implementation shown, folding may continue until only two segments remain. The residue of the final two segments (e.g., remaining-segments mod g) can be determined in a variety of ways as described below. The folding operations shown in FIG. 1 use constants K1 and K2 which can be pre-computed prior to accessing any segments of S. These constants may be determined as:

$$K1 = 2^y \bmod g$$

$$K2 = 2^x \bmod g$$

where x and y demarcate the boundary of the most significant segments folded into the remaining segments. For example, as shown in FIG. 1, y represents the ending bit position of segment 100b within the subset of segments 100a-100d and x represents the ending bit position of segment 100a within the subset 100a-100d. The values of x and y may vary in different implementations and architectures. For instance, for an implementation that operates on subsets of 64-bit segments, y may have a value of 128 and x may have a value of 192. However, in another 64-bit segment implementation, y may have a value of 96 and x may have a value of 160. For an implementation using 32-bit segments, x may have a value of 64 and y may have a value of 96.

The contribution of a given segment (e.g., 100a, 100b) to the message residue can, thus, be expressed as S[ ]·Kn. This technique described is well suited to execution on processors that have a Galois-field (carry-less) multiplier, though such hardware is not an implementation requirement.

Since g, x, and y, are constants, a set of K values (e.g., K1, K2, . . . ) can be pre-computed and stored prior to processing of the data values of S. Potentially, different sets of K can be pre-computed and stored for different values of g, x, and/or y. Such an implementation can quickly switch between polynomials by a lookup of a set of K values based on the particular computational setup.

Specific examples described above illustrated determination of a 32-bit CRC polynomial however the techniques described above may be applied to different sized remainders and/or polynomials. The techniques described above work also may work for arbitrary and/or non-uniform segment sizes. Additionally, while the above described folding operations 108a, 108b that operate on 4-segment subsets, other implementations may operate on a different number of segments. For example, instead of 4:2 segment reduction another implementation may feature a different segment reduction ratio. For instance, another implementation may fold more than two segments per iteration 108. Further, while the above describes a CRC message residue, the techniques described above can be used in other operations that determine a message residue or perform a modular reduction of a polynomial.

Figure 2:
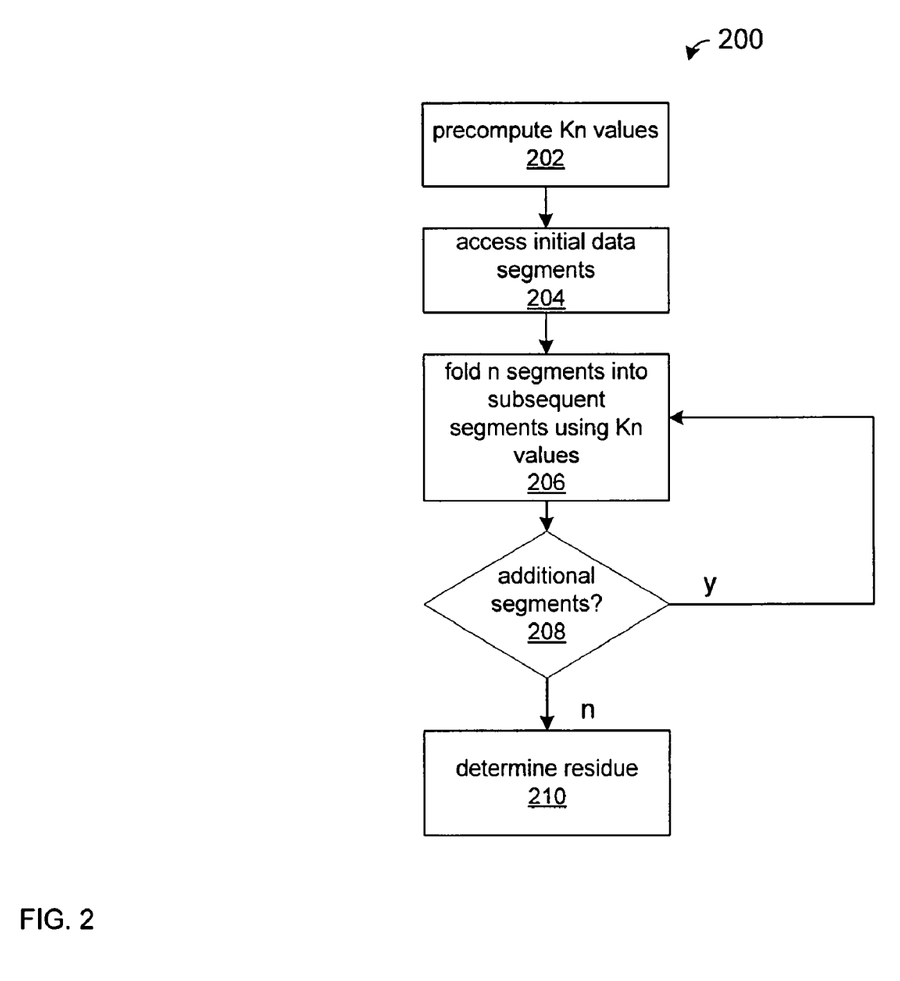
FIG. 2 is a flow-chart of a process to determine a message residue.

FIG. 2 illustrates a sample process for computing a message residue. As shown, after computing K values 202, the initial data segments 204 are reduced 206 to a set of fewer but equivalent data segments with respect to the residue by folding multiple segments into the remaining message at a time. If additional segments remain 208, reducing 206 continues with each reducing folding multiple segments into remaining ones. As shown, a final residue value 210 can be determined for the final set of remaining segments.

A variety of approaches can determine the final residue value such as a lookup table or a wide variety of algorithms (e.g., Barrett's reduction) to determine a modular remainder. For example, the final segments can be processed using an approach that implements the division process as multiplication. For instance, a n-bit remainder, $r_n$, can be expressed as:

$$r_n = L(g^* \cdot (M(s \cdot q+)))$$

where
L is an operation returning the b-least-significant-bits of data;
g* is the b-least-significant bits of polynomial g,
M is an operation returning the b-most-significant-bits,
q+ is the quotient of $(2^{2n}/g)$, and
b is (width of g)−1.

Like the folding techniques described above, this approach can use pre-computed values for g* and q+ to speed computation.

Figure 3:
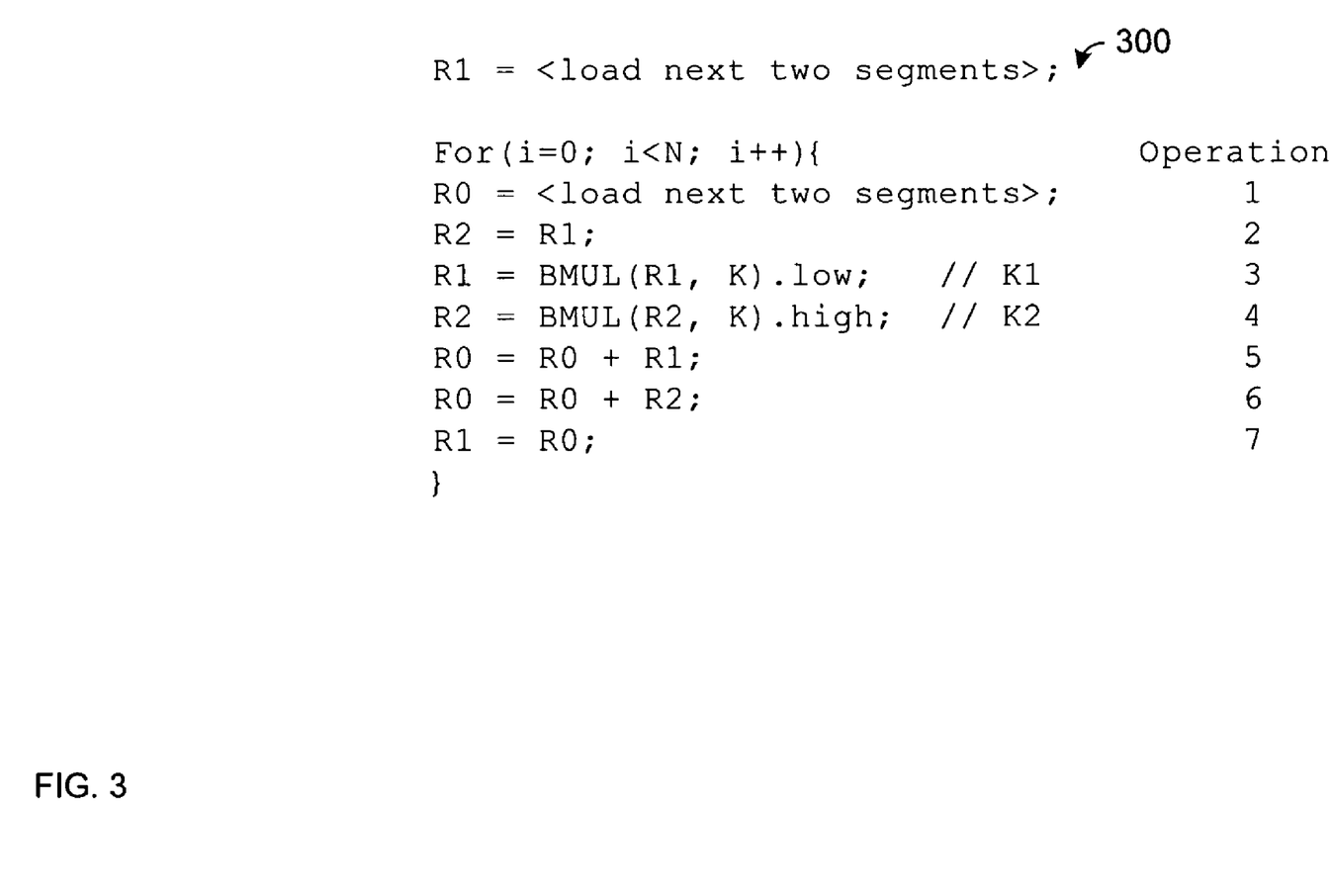
FIG. 3 is code illustrating reduction of message segments used to represent a message.

FIG. 3 illustrates a sample implementation 300 of the reduction techniques described above. As shown, the inner loop of code 300 includes a sequence of 7-instructions. In this example, the high order bits of R1 and R2 initially store the value of the first segment, the low order bits of R1 and R2 initially store the value of the second segment, and a register, K, stores both K2 and K1 in the respective high and low order bits of a register.

Two of the operations (operation 3 and 4) use a binary polynomial multiplication instruction (labeled "BMUL") that performs a polynomial multiplication over GF(2) of specified portions of the operands. That is, the instruction can operate on either the high order and/or low order half of the operands as indicated by the notation ".high" or ".low". For example, BMUL (R1, K).low multiplies the lower half of R1 by the lower half of the register K (e.g., K1). A sample implementation of circuitry to implement this instruction is described below in conjunction with FIG. 6.

In this particular implementation, each segment is 32-bits and each register (e.g. R0, R1, R2) is 64-bits. For architectures using a 64-bit datapath and/or 64/128-bit register files, the use of 32-bit segments and constant values, K, can reduce the need to shift or mask registers to access segment and constant values during folding operations. Other implementations, however, can feature different sized segments and constants and may be tailored for other architectures.

Figure 4:
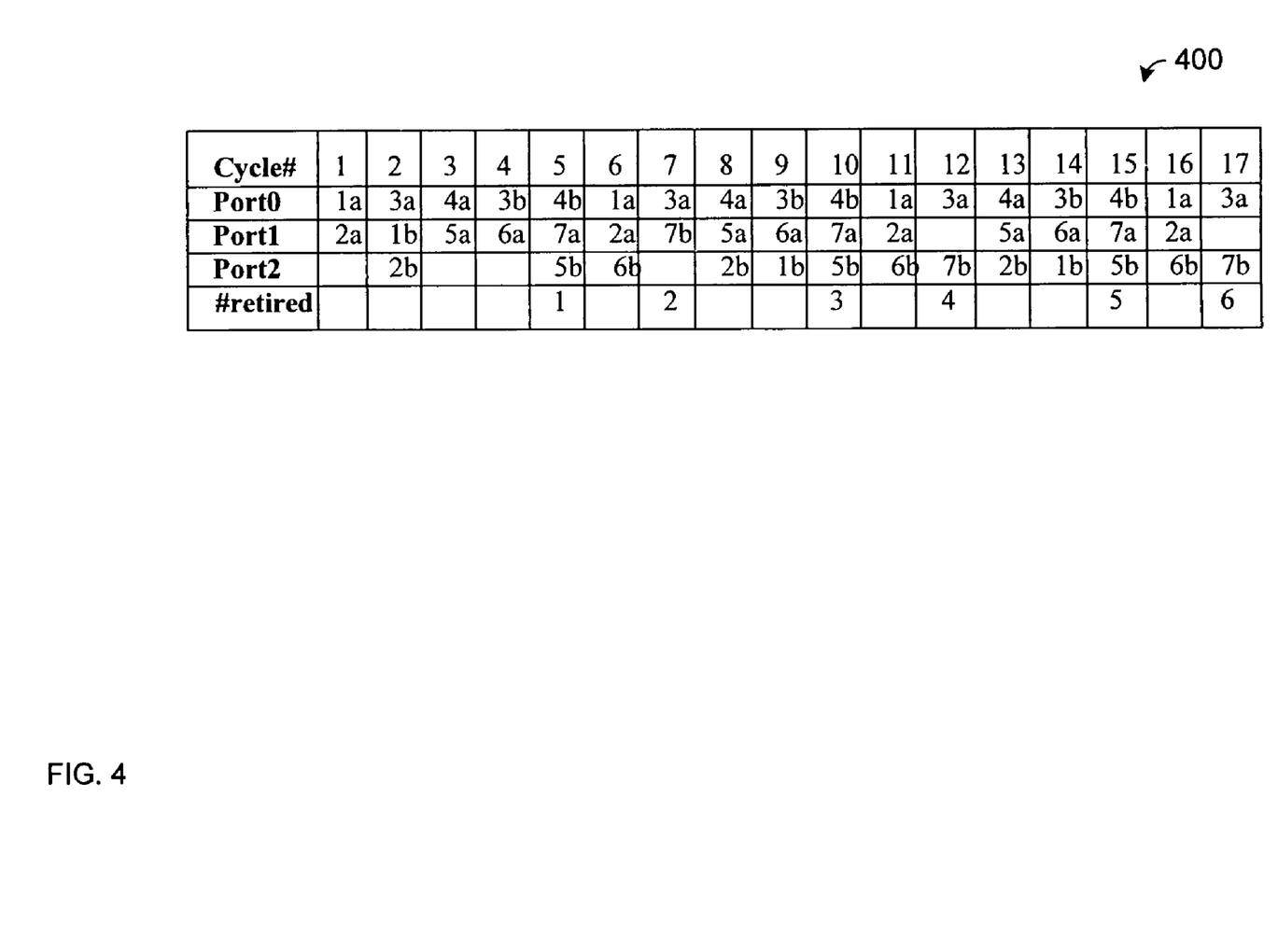
FIG. 4 is a sample execution schedule of instructions to reduce message segments used to represent a message.

A given set of instructions using the techniques above can be scheduled in a variety of ways to increase overall throughput. For example, FIG. 4 illustrates an instruction execution schedule 400 that operates on two different messages ("a", "b") in parallel. The schedule 400 shown identifies the cycle/processor execution port of the instructions 300 of the sample implementation of FIG. 3. For example, in cycle 1, inner-loop instructions 1 and 2 are executed for message "a" (labeled 1a, 2a), while in cycle 2, instruction 3 is executed for message "a" (labeled 1a) and instructions 1 and 2 are executed for message "b" (labeled 1b, 2b).

The sample schedule 400 shown in FIG. 4 reflects a processor architecture featuring multiple ports of execution, though only a single port (port0) implements or is used to execute the binary polynomial multiplication instruction. The schedule 400 also reflects an architecture where the binary polynomial multiplication instruction is a 1-cycle operation. In this sample schedule 400, each iteration of the folding process consumes 7-cycles for the inner loop and uses 4-registers (R0, R1, R2, and a register to store K1 and K2). As shown, 6 8-byte blocks are processed after 17 cycles, averaging close to 3-cycles per 8-byte block. Continued operation approaches an average of 2.5 cycles per block.

Figure 5:
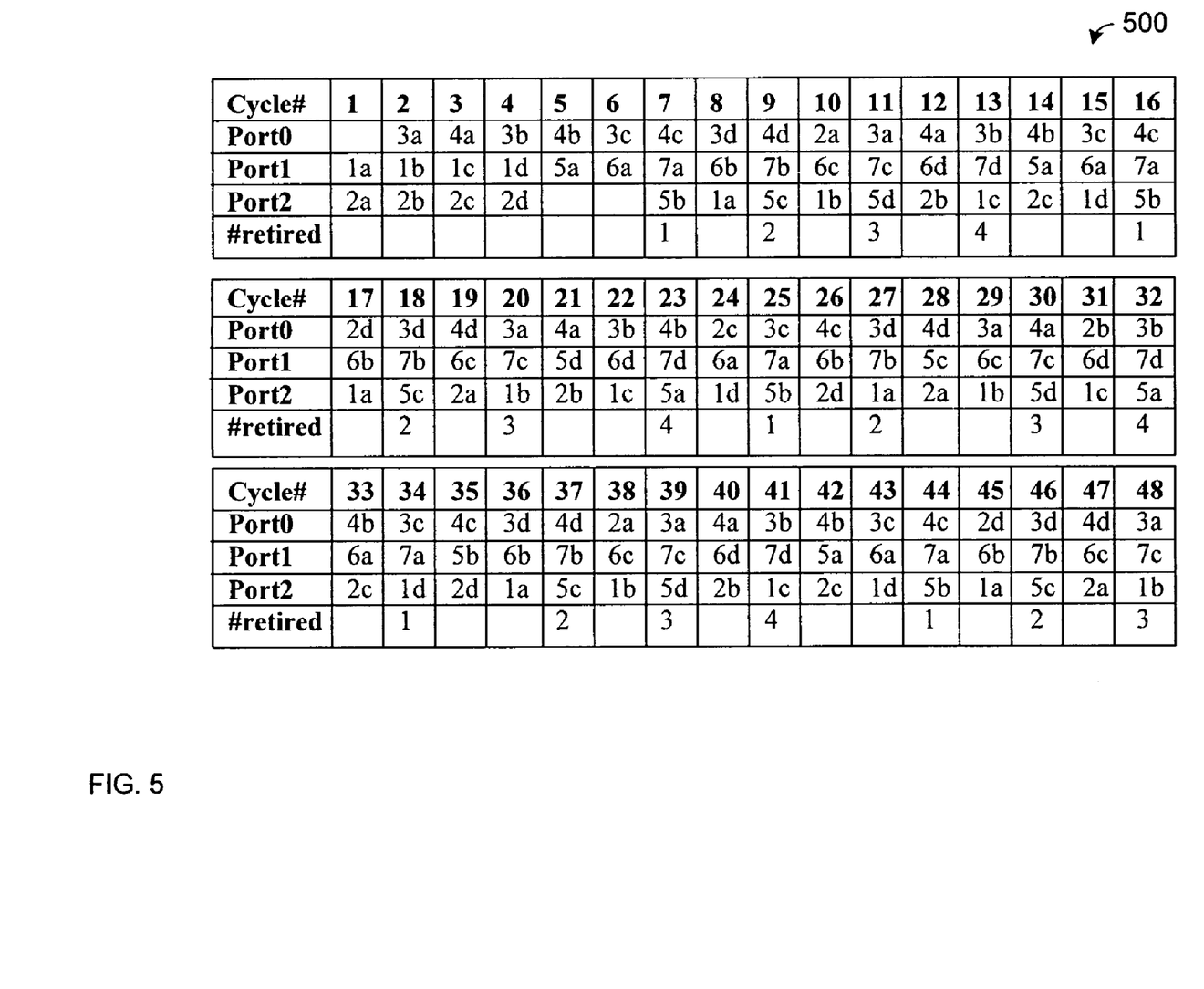
FIG. 5 is a sample execution schedule of instructions to reduce message segments used to represent a message.

FIG. 5 depicts another schedule 500 where the binary polynomial multiplication instruction is assumed to take 3-cycles instead of 1-cycle. While this may increase the total number of instruction cycles used to perform the reduction and may increase the number of registers used, increasing the number of messages simultaneously processed can mask the increase in instruction execution time and nevertheless attain similar performance to the 1-cycle binary polynomial multiplication instruction. For example, the schedule 500 of FIG. 5 processes 4-messages ("a", "b", "c", and "d") simultaneously and, again, achieves close to 2.5 cycles per 8-byte block.

Other schedules are possible for different architectures and different instructions used to implement the folding operations than those described above. For example, a processor implementing the binary polynomial multiplication instruction on multiple processor execution ports can initiate execution of instructions 3 and 4 in the same cycle.

Figure 6:
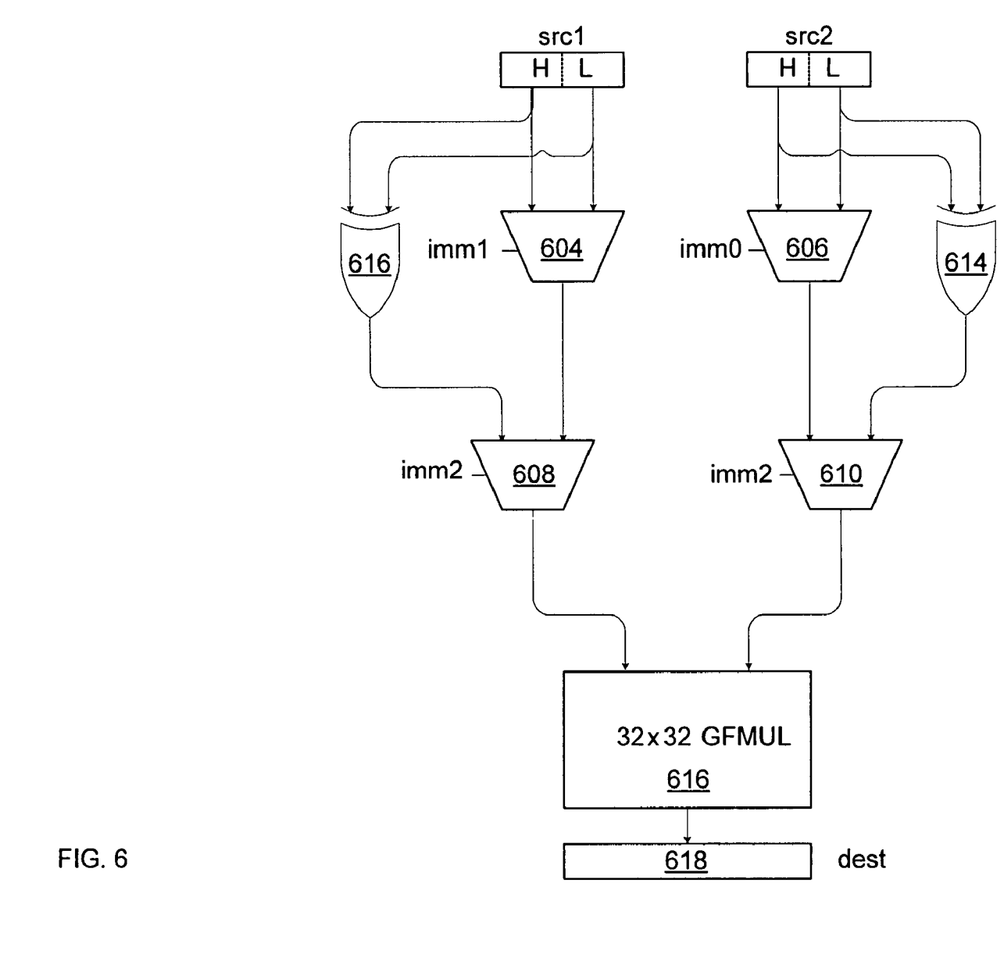
FIG. 6 is a diagram of a sample binary polynomial multiplication circuit.

FIG. 6 depicts a sample of circuitry that may be used to implement the binary polynomial multiplication instruction. In particular, the instruction operates on two operands, src1 and src2. Based on the values imm1 and imm0, the circuitry selects 604, 606 the specified High ("H") or Low ("L") order bits of the operands to supply to the multiplier 616. The circuitry can also perform XOR-ing 616, 614 of the High and Low portions of either operand if imm2 is set. The multiplier 616 stores output to the specified destination register 618.

Expressed as pseudo-code, the circuitry implements logic for an instruction having a syntax of:

$$dest = BMUL(source1, source2)imm8$$

where the imm8 modifier is composed of imm2, imm1, imm0 bits. The values of these bits instruct the logic to perform the following operations:

| imm2 | imm1 | imm0 | Operations |
|---|---|---|---|
| 0 | 0 | 0 | Src1__low × src2__low |
| 0 | 0 | 1 | Src1__low × src2__high |
| 0 | 1 | 0 | Src1__high × src2__low |
| 0 | 1 | 1 | Src1__high × src2__high |
| 1 | 0 | 0 | (src1__low ⊕ src1__high) × (src2__low ⊕ src2__high) | where, in a 64-bit register implementation, low corresponds to bits [31:0] and high corresponds to bits [63:32]. The circuitry like that shown can reduce shifting and masking used to access segment/constant values. However, a wide variety of other implementation of the binary polynomial multiplication instruction are easily constructed. Additionally, other implementations may feature different circuit components, feature a different syntax, and perform different operations on operands.

Figure 7:
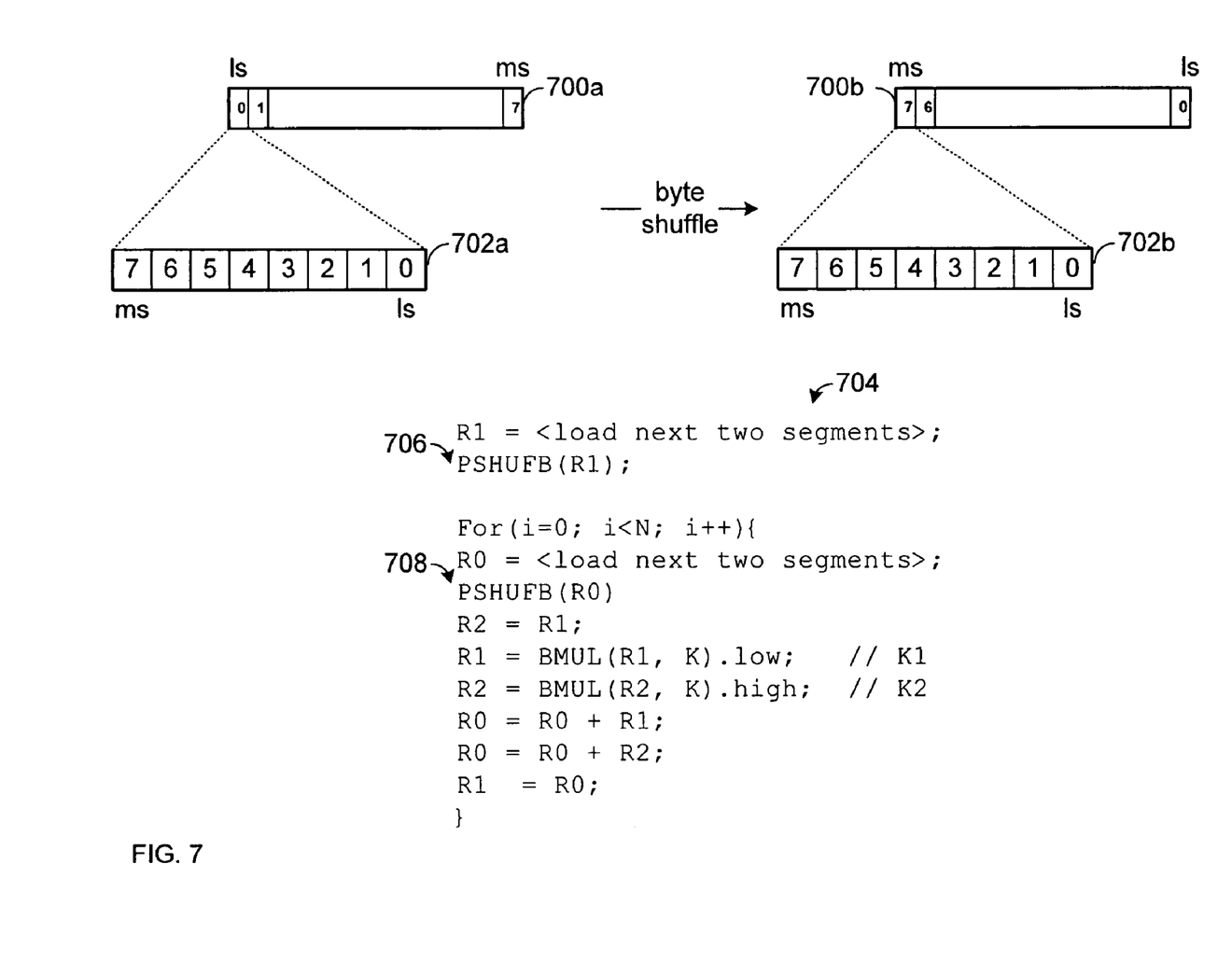
FIG. 7 is a diagram illustrating a byte shuffle operation to re-order message bits in order of significance.

Implementations of techniques described above may also vary based on the byte arrangement and endianess of message bytes. For example, FIG. 7 illustrates message bytes 700a ordered from low-order byte (byte-0) to high (byte-15) where the high order byte represents the next sequential byte of a message. However, as shown in the scenario, each byte within the message has a little-endian format 702a. Thus, the sequence of bits within the message 700a are not arranged in a linearly ascending or descending order of significance. This "saw-tooth" arrangement of bits, where the byte arrangement is the opposite of the bit endian-ness within a byte, may make computations more difficult.

To organize the bits into a linear sequence, a byte shuffle operation may be used. For example, as shown in FIG. 7, shuffling bytes of message 700a yields message 700b. Since both the bytes of message 700b and the bits within the bytes of message 700b are arranged in the same sequence of significance (high to low), the bits of message 700a linearly descend from high to low significance. As shown, pseudo-code 704 features shuffle byte (PSHUFB) instructions 706, 708 that reorder bytes of a message portion to create a linear descending arrangement of bits.

Figure 8:
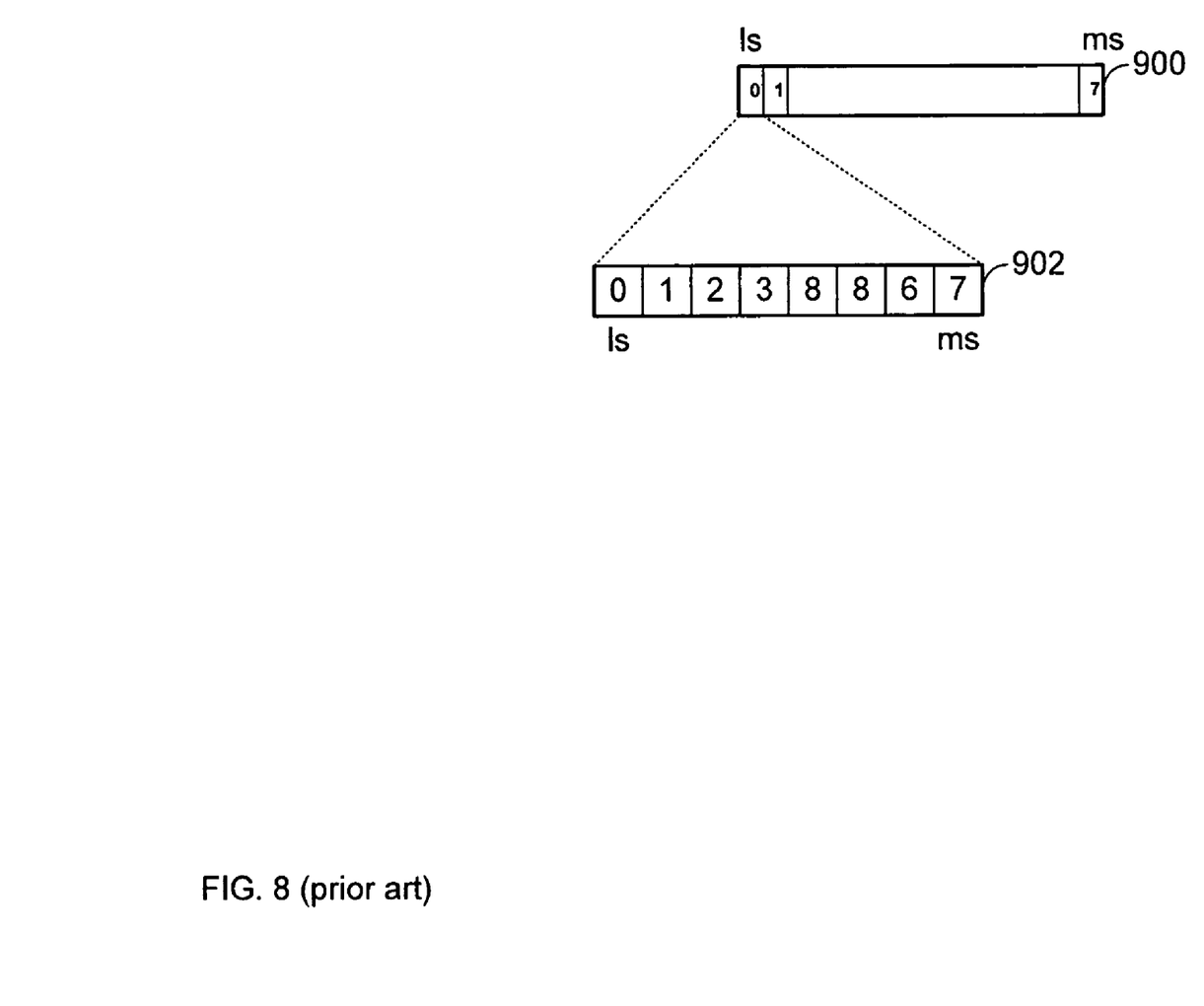
FIG. 8 is a diagram illustrating segment reduction of a message having bits arranged in little-endian format.
Figure 9:
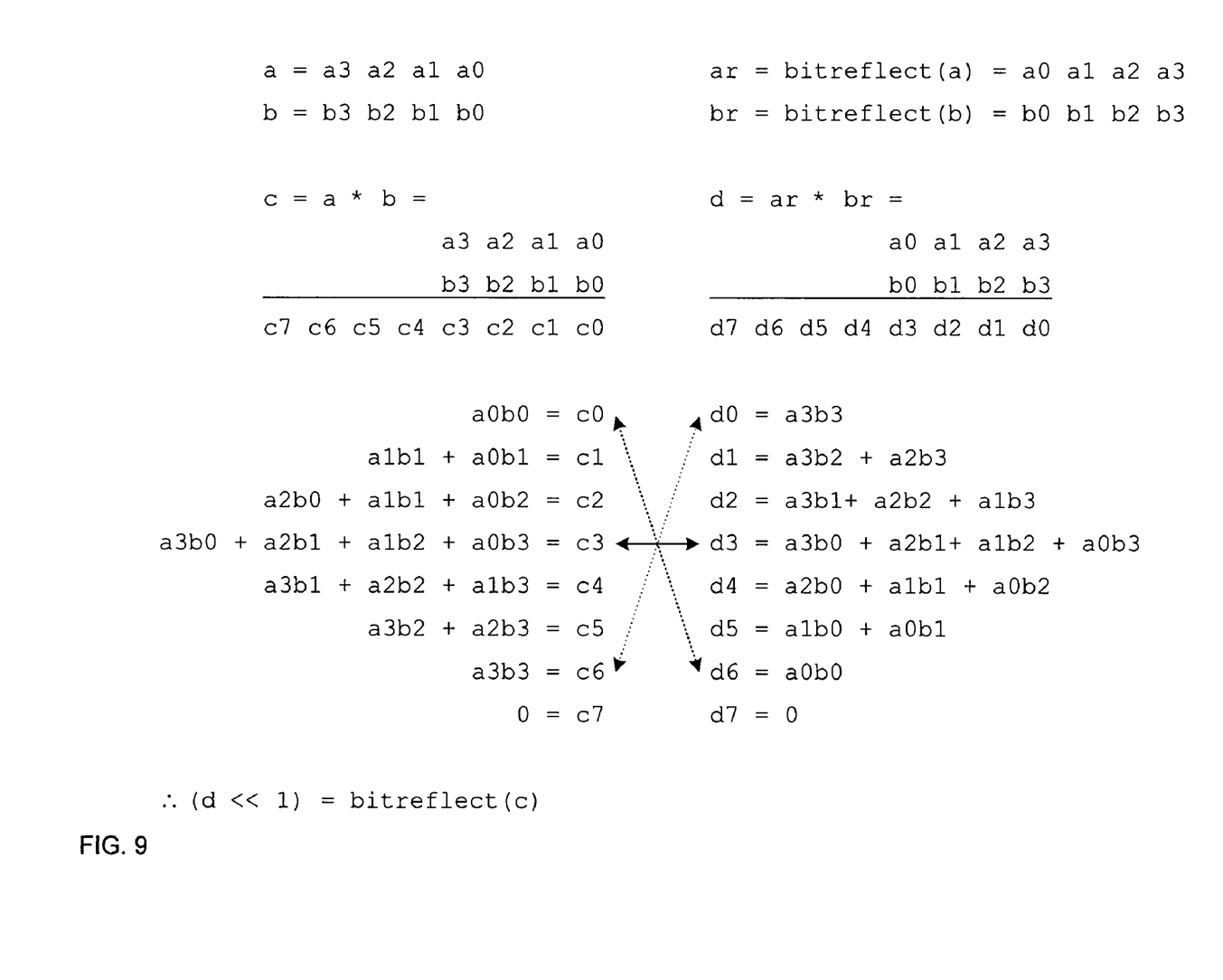
FIG. 9 is a diagram illustrating a relationship between multiplication of operands and multiplication of bit reflected operands.

FIG. 8 depicts another scenario where the bytes 902 feature a big-endian format and the bytes are arranged from low to high significance. While the bits proceed in a linearly increasing order of significance, from the least significant bit to the most significant, the bit ordering is the exact opposite of the arrangement of message 700b in FIG. 7. Instead of rearranging the bits, however, FIG. 9 illustrates a technique that permits circuitry operating on the "reversed" message to proceed without time consuming bit or byte rearrangement. Briefly, due to the bit-agnostic property of polynomial multiplication (i.e., the columns are independent), the constants used can be computed to properly operate on the reversed message, obviating the need for bit-reflections or byte shuffles.

To illustrate, FIG. 9 shows two four-bit numbers a and b. As shown, polynomial multiplication of the bits of a and b yield the bit-values of byte c. FIG. 9 also depicts polynomial multiplication of bit-reflections of a and b, labeled $a_r$ and $b_r$, to yield the bit-values of byte d. As shown, the values of c and d, excluding the most-significant 0, mirror each other. That is, $c_0=d_6$, $c_1=d_5$, $c_2=d_4$, and $c_3=d_3$. In other words, d[6:0]=bitreflect(c[6:0]). Including the zero value of $c_7$ and $d_7$, d<<1=bitreflect(c). While FIG. 9 features 4-bit numbers, this relationship equally applies to larger numbers.

Figure 10:
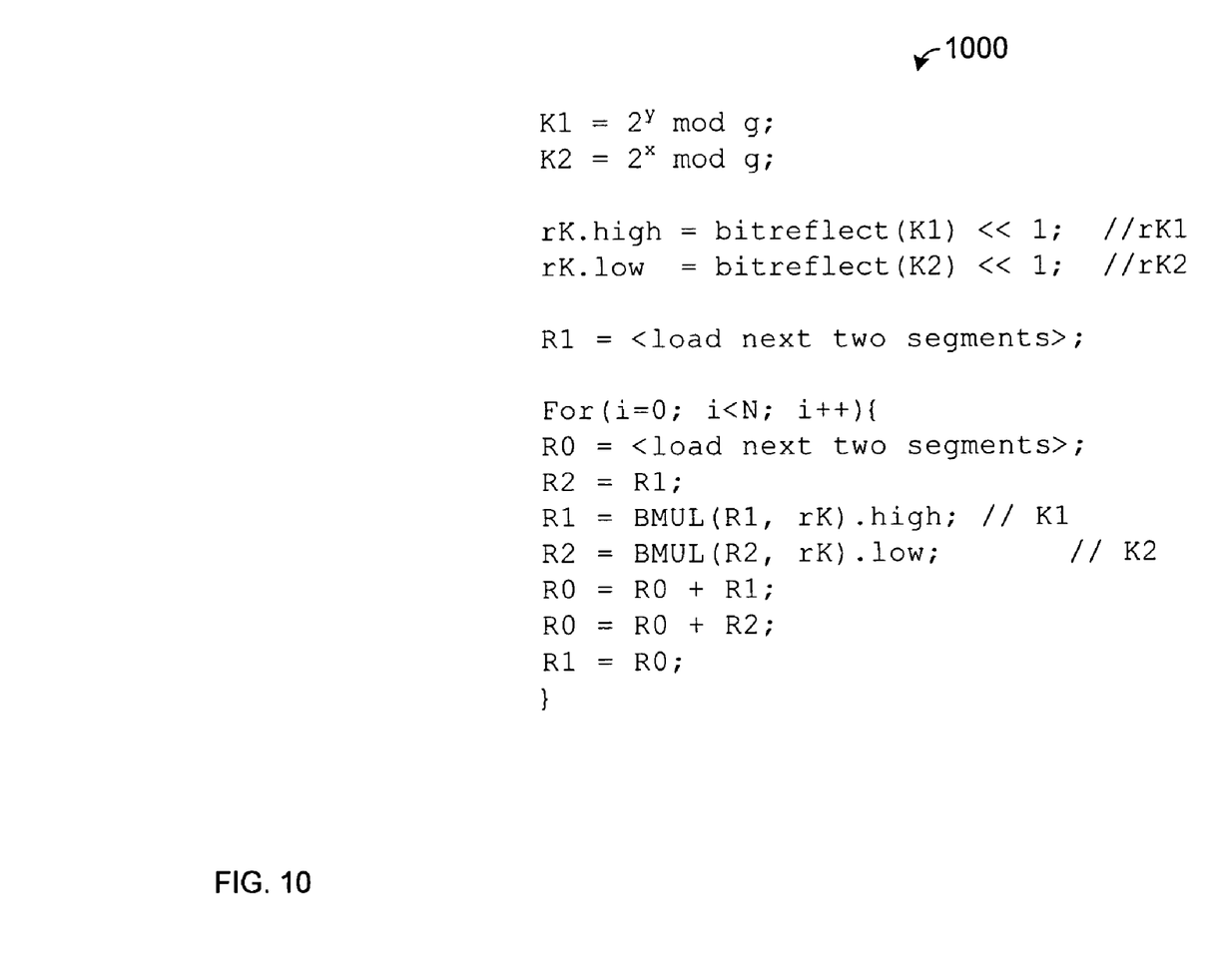
FIG. 10 is code illustrating reduction of message segments having bits arranged in big-endian format.

Circuitry can be constructed based on this relationship to permit processing of the "reverse" bit-ordering shown in FIG. 8 without bit reflections or byte shufflings. In other words, instead of rearranging the bit-sequence of the message, the procedure can operate on the bits, as is, by reflecting the constants, K, and shifting them to the left by one. Thus, as shown in FIG. 10, code 1000 performs a bit-reflection and shift of each K value to yield the rK values. This can be a one-time operation performed before processing of a message. As shown, the procedures 1000 uses the rK values in a polynomial multiplication operation with message segments similar to that shown in FIG. 3, though with constant values that reflect the bit-ordering.

The ability to operate on a reflected message may be used in other modular reduction schemes than that described above. For example, a reflected and shifted constant may be used in a scheme that folds a single segment per iteration instead of multiple segments. Additionally, the more general technique of processing a reflected bit sequence with binary polynomial multiplication of a bit reflected/shifted value may be used in a wide variety of applications.

The techniques described above can be implemented in a wide variety of logic. For example, the techniques may be implemented as circuitry (e.g., a processor element (e.g., a CPU (Central Processing Unit) or processor core) that executed program instructions disposed on a computer readable storage medium. While the logic was illustrated as programmatic instructions executed by processor circuitry, the techniques may be implemented in dedicated digital or analog circuitry (e.g., expressed in a hardware description language such as Verilog™), firmware, and/or as an ASIC (Application Specific Integrated Circuit) or Programmable Gate Array (PGA). Alternately, the circuitry may feature a combination of dedicated hardware and programmable execution (e.g., a processor that implements a program that uses a Galois-field (carry-less) multiplier or multiplier configured to handle carry-less multiplication.

The logic may be integrated within a discrete component such as a NIC (Network Interface Controller), framer, offload engine, storage processor, and so forth. For example, to process a received protocol data unit (PDU), a component may verify a CRC value included with the PDU. Alternately, for egress packets, the component may generate a CRC value for including in the PDU. Such components may include a PHY coupled to a MAC (media access controller) (e.g., an Ethernet MAC). As another example, these techniques may be implemented in blade circuitry for insertion into a chassis backplane.

Other embodiments are within the scope of the following claims.

What is claimed is:

1. Circuitry for determining a modular remainder with respect to a polynomial of a message comprised of a series of segments, comprising circuitry to:
repeatedly:
access a strict subset of segments, the strict subset consisting of the most significant segments representing the message;
independently multiply each of at least the two most significant segments by respective constants;
transform the strict subset of segments into a smaller set of segments based on the independently multiplying each of at least the most significant segments by respective constants; and
determine the modular remainder based on a set of segments output by the repeatedly accessing, multiplying, and transforming; and
store the determined modular remainder.

2. The circuitry of claim 1, wherein the circuitry comprises circuitry to:
simultaneously process at least one second message by repeatedly:
accessing a strict subset of segments of the second message, the strict subset consisting of the most significant segments representing the second message;
independently multiplying each of at least the two most significant segments of the second message by the respective constants;
transforming the strict subset of segments of the second message into a smaller set of segments based on the independently multiplying each of at least the most significant segments of the second message by the respective constants.

3. The circuitry of claim 1, wherein the strict subset of segments consists of four segments and the smaller set of segments consists of two segments.

4. The circuitry of claim 1, wherein the modular remainder comprises a CRC (Cyclic Redundancy Check) value.

5. The circuitry of claim 1,
wherein the constants comprise constants derived by segment size and the polynomial.

6. The circuitry of claim 5,
wherein the circuitry comprises circuitry to determine a value based on the least significant of the subset of segments and the multiplication of the most significant segments by constants derived from the segment size and the polynomial.

7. The circuitry of claim 6, wherein the circuitry comprises circuitry to:
access a set of constants, determined prior to accessing the message, based on at least one of: (a) the polynomial and (b) a size of a segment.

8. The circuitry of claim 1,
wherein the message comprises a set of segments, S, of size n where n is an integer;
wherein each constant is determined by $Kn=2^z$ mod polynomial where z is an integer that differs for different constants and n is an integer identifying a one of the constants;
wherein the circuitry comprises circuitry to perform polynomial multiplication of the most significant remaining segment of S by a first one of the constants and the next most significant segment of S by a second one of the constants and xor the results with remaining segments in the strict subset of segments.

9. The circuitry of claim 1,
wherein the message comprises a set of segments, S, of size n where n is an integer;
wherein each constant is determined by $rKn=\text{bitreflect}(2^z \text{ mod polynomial})<<1$, where z is an integer that differs for different constants and n is an integer identifying a one of the constants;
wherein the circuitry comprises circuitry to perform polynomial multiplication of the most significant remaining segment of S by a first one of the constants and the next most significant segment of S by a second one of the constants and xor the results with remaining segments in the strict subset of segments.

10. Computer program instructions disposed an a computer readable storage medium, the instructions, when executed, cause a processor to determine a modular remainder with respect to a polynomial of a message comprised of a series of segments, the instructions comprising instructions to cause the processor to:
repeatedly:
access a strict subset of segments, the strict subset consisting of the most significant segments representing the message;
independently multiply each of at least the two most significant segments by respective constants;
transform the strict subset of segments into a smaller set of segments based on the independently multiplying each of at least the most significant segments by respective constants; and
determine the modular remainder based on a set of segments output by the repeatedly accessing, multiplying, and transforming; and
store the determined modular remainder.

11. The computer program instructions circuitry of claim 10, wherein the instructions comprise instructions to cause the processor to:
simultaneously process at least one second message by repeatedly:
accessing a strict subset of segments of the second message, the strict subset consisting of the most significant segments representing the second message;
independently multiplying each of at least the two most significant segments of the second message by the respective constants;
transforming the strict subset of segments of the second message into a smaller set of segments based on the independently multiplying each of at least the most significant segments of the second message by the respective constants.

12. The computer program instructions of claim 11, wherein the instructions cause the processor to:
determine a value based on the least significant of the subset of segments and the multiplication of the most significant segments by constants derived from the segment size and the polynomial;
wherein each constant is determined by $Kn=2^z$ mod polynomial where z is an integer that differs for different constants and n is an integer identifying a one of the constants;
wherein the instructions comprise instructions to cause the processor to perform polynomial multiplication of the most significant remaining segment of the message by a first one of the constants and the next most significant segment of the message by a second one of the constants and xor the results with remaining segments in the strict subset of segments.

13. A communications system, comprising:
at least one PHY to receive signals from a communications medium,
at least one MAC (media access controller) coupled to the at least one PHY; and
circuitry to
repeatedly:
- access a strict subset of segments, the strict subset consisting of the most significant segments representing the message;
- independently multiply each of at least the two most significant segments by respective constants;
- transform the strict subset of segments into a smaller set of segments based on the independently multiplying each of at least the most significant segments by respective constants; and
- determine the modular remainder based on a set of segments output by the repeatedly accessing, multiplying, and transforming; and
- store the determined modular remainder.

14. The communications system of claim 13, wherein the circuitry comprises circuitry to:
simultaneously process at least one second message by repeatedly:
- accessing a strict subset of segments of the second message, the strict subset consisting of the most significant segments representing the second message;
- independently multiplying each of at least the two most significant segments of the second message by the respective constants;
- transforming the strict subset of segments of the second message into a smaller set of segments based on the independently multiplying each of at least the most significant segments of the second message by the respective constants.

15. The communications system of claim 13, wherein the circuitry comprises circuitry to:
- determine a value based on the least significant of the subset of segments and the multiplication of the most significant segments by constants derived from the segment size and the polynomial;
- wherein each constant is determined by $Kn=2^z$ mod polynomial where z is an integer that differs for different constants and n is an integer identifying a one of the constants;
- wherein the circuitry comprises circuitry to perform polynomial multiplication of the most significant remaining segment of the message by a first one of the constants and the next most significant segment of the message by a second one of the constants and xor the results with remaining segments in the strict subset of segments.

* * * * *